United States Patent
Vashchenko et al.

(10) Patent No.: US 6,933,588 B1
(45) Date of Patent: Aug. 23, 2005

(54) HIGH PERFORMANCE SCR-LIKE BJT ESD PROTECTION STRUCTURE

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/134,805

(22) Filed: Apr. 29, 2002

(51) Int. Cl.[7] .......................................... H01L 27/082
(52) U.S. Cl. ................. 257/565; 257/107; 257/918; 257/553; 257/658; 257/577; 257/355; 257/173; 257/567; 257/592; 257/362; 257/110; 257/343
(58) Field of Search ........................... 257/565, 107, 257/918, 553, 658, 355, 577, 362, 162, 141, 257/146

(56) References Cited

U.S. PATENT DOCUMENTS

| | | | | |
|---|---|---|---|---|
| 5,376,231 A | * | 12/1994 | Matsumoto et al. | 438/3 |
| 6,348,724 B1 | * | 2/2002 | Koomen et al. | 257/577 |
| 6,472,286 B1 | * | 10/2002 | Yu | 438/342 |

* cited by examiner

*Primary Examiner*—Eddie Lee
*Assistant Examiner*—Junghwa Im
(74) *Attorney, Agent, or Firm*—Jurgen Vollrath

(57) ABSTRACT

In a NPN transistor electrostatic discharge (ESD) protection structure, certain parameters, including maximum lattice temperature, are improved by introducing certain process changes to provide for SCR-like characteristics during ESD events. A p+region is formed adjacent the collector to define a SCR-like emitter and with a common contact with the collector of the BJT. The p+ region is spaced from the n-emitter of the transistor by a n-epitaxial region, and the collector is preferably spaced further from the n-emitter than is the case in a regular BJT.

9 Claims, 2 Drawing Sheets

HIGH PERFORMANCE SCR-LIKE BJT ESD PROTECTION STRUCTURE

FIELD OF THE INVENTION

The invention relates to electrostatic discharge (ESD) protection structures implemented in a BiCMOS or BCD process. In particular it relates to a bipolar junction transistor (BJT) ESD protection structure.

BACKGROUND OF THE INVENTION

In order to protect integrated circuit devices (ICs) against damage due to electrostatic discharge, it is common to include either separate ESD protection devices for channeling high ESD currents to ground, or to create self protecting I/O cells in which the same device is used as a high current output driver as well as for ESD protection.

The most compatible ESD protection structure for integration in different BiCMOS/BCD products is a NPN BJT, such as the one illustrated in FIG. 1. The NPN BJT 100 includes a p-type base 102 formed in a n-epitaxial layer 104. The base 102 is contacted through a contact 106. An n-type emitter 108, in turn, is contacted by an emitter contact 110. The BJT further includes a collector comprising a n-sinker region 112, which is contacted by a contact 114 (in this case, through a n+ region 116). The collector is isolated from the emitter 110 by an isolation region 120. The I-V curve of a NPN BJT such as the one illustrated in FIG. 1, displays a distinct S-shaped characteristic as shown in FIG. 2. This is due to avalanche injection conductivity modulation, which takes place at triggering and allows the device to deliver high current densities after triggering ($V_{TR}$). Although the same avalanche injection conductivity modulation takes place in NMOS and DMOS devices, NMOS and DMOS devices display sensitivity to electrical, thermal and hot carrier overstress, due to the presence of a gate region.

Nevertheless, the NPN BJT also has its limitations, especially when designing high voltage (50–200V) circuits. The combination of high avalanche current and high electric field in conjunction with current redistribution effects at negative differential conductivity (upper part of S-shaped curve of FIG. 2) results in excessive currents and heating in the structure.

SUMMARY OF THE INVENTION

The present invention proposes a compact ESD protection triggering structure making use of thyristor type conductivity modulation that involves double-carrier injection. In particular, the invention proposes a new BJT structure having SCR-like characteristics. According to the invention, a SCR-like structure is built based on a BJT structure with some process changes.

According to the invention, there is provided an ESD protection structure comprising a NPN BJT-like structure having a p-doped region in or adjacent the collector that has a common contact with the collector.

Further, according to the invention, there is provided an ESD protection structure comprising a BJT structure that includes a n-type emitter, at least one p-type base region formed in a n-material, and a n-type collector region, and further comprising a p-type region formed adjacent to or partially replacing the collector, and having a common contact with the collector. The n-type collector preferably comprises a shallow n+ composite which may be formed in a n-sinker, which, in turn, may be formed in a n-epitaxial region. The p-type region may be formed as a shallow p+ region overlapping, abutting or spaced from the shallow n+ composite. The n-epitaxial region may be formed on a n-buried layer (NBL), and the n-type emitter may be formed in the p-type base region.

Still further, according to the invention, there is provided method of improving the characteristics of a BJT snapback ESD protection structure, comprising introducing a p-type region abutting or partially overlapping a n-type collector and providing the p-type region and n-type collector with a common contact. Typically the n-type collector includes a n-sinker region. Preferably, the p-type region is formed as a shallow p+ region, and the n-type collector includes a shallow n+ region in the n-sinker region. The n-sinker region is typically spaced from a n-type emitter of the BJT by a n-epitaxial region. The n-sinker region may be formed further away from the n-type emitter of the BJT than is typical for a regular BJT using the same process. The n-sinker may be formed 0.5 $\mu$m to 1 $\mu$m further away.

Still further, according to the invention, there is provided method of improving the characteristics of a BJT snapback ESD protection structure, comprising introducing a p-type region, which may take the form of a shallow p+region, abutting or partially overlapping the collector of the BJT and with a common contact to the collector, for achieving double carrier injection at breakdown. Typically the collector includes a n-sinker region, and the p+ region partially replaces the n-sinker region.

DETAILED DESCRIPTION OF THE INVENTION

Figure 1:
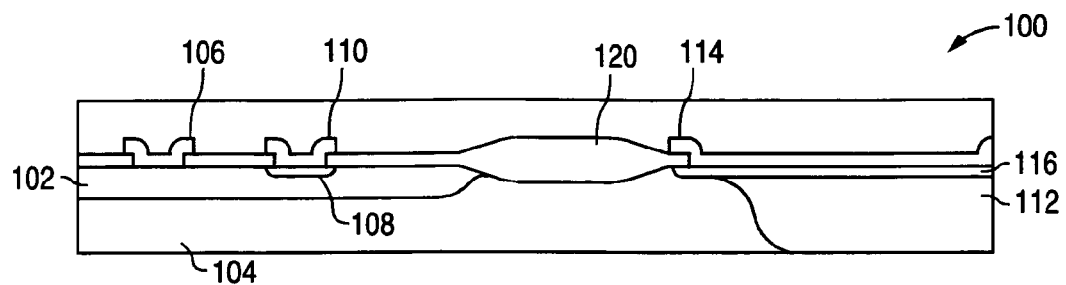
FIG. 1 is a sectional view through a prior art NPN BJT device.
Figure 2:
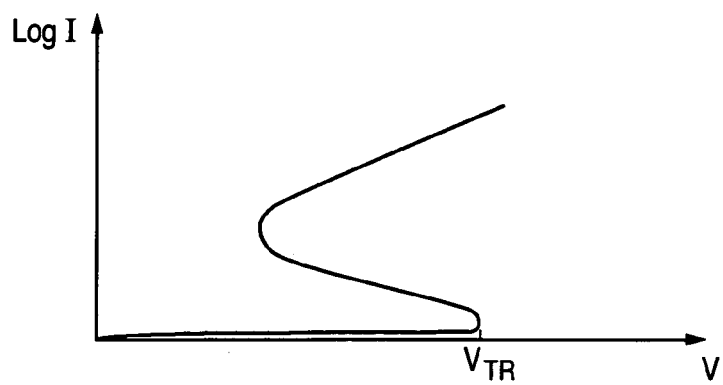
FIG. 2 is a typical I-V curve for a NPN snapback structure.
Figure 3:
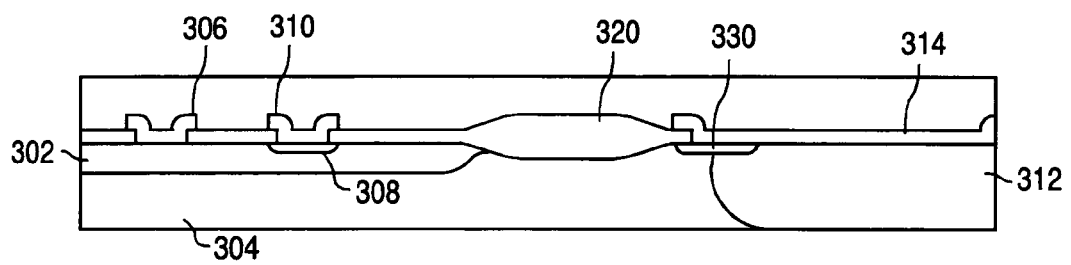
FIG. 3 is a sectional view through one embodiment of the invention.

FIG. 3 shows one embodiment of an ESD protection structure 300 of the invention. It has many of the features of a regular NPN BJT. It includes a p-type base 302 formed in n-type material such as a n-epitaxial layer 304. The base 302 is contacted by a contact 306. The structure 300 further includes a n-type emitter 308 formed in the p-type material that defines the base 302. The emitter 308 is contacted by a contact 310 and is spaced from a n-sinker 312 forming the collector. The collector 312, in turn, is contacted by a contact 314. An isolation region 320 isolates the emitter from the collector. The present embodiment also includes a shallow p+region 330, which serves as a second emitter to define a SCR-like structure, as is discussed in greater detail below. As shown in FIG. 3, the p+ emitter 330 and collector 312 are contacted by a common contact 314.

It will be appreciated that if the doping of the shallow p+ emitter 330 is larger than the doping of the n-sinker 312, the p+ material will overpower the n-material to form a p+ region at the top, leaving a n-region below it, thus functioning like a diode. It is, therefore, important that the p+ emitter does not extend along the entire width of the sinker. On the other hand, if the doping of the p-emitter is lower than that of the n-sinker, any overlapping portion will be overpowered by the n-sinker leaving only a p-n junction outside the sinker region.

Figure 4:
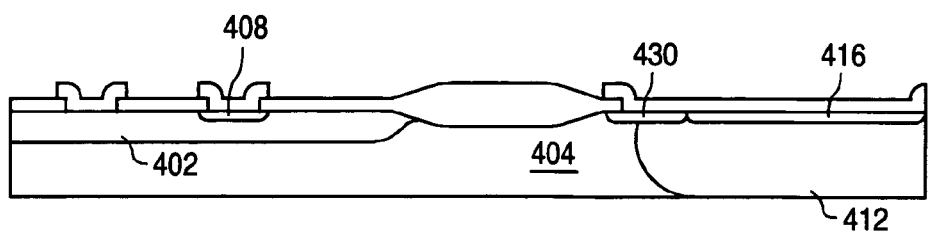
FIG. 4 is a sectional view through another embodiment of the invention.

In a preferred embodiment, as illustrated in FIG. 4, the collector includes a shallow n+ region 416 formed in the sinker region 412. The n-sinker region 412 is formed further away from the emitter 408, and a shallow p+ region 430 is formed to partially overlap the n-sinker region 412 to either abut the shallow n+ region 416 or be spaced from the shallow n+ region 416, or partially replace the n+ region 416 as illustrated in the embodiment of FIG. 4. The doping level of the p+ region is chosen to be higher than that of the sinker 412, and the p+ region, in this embodiment, extends into the sinker region 412.

By introducing a p-type emitter sharing a common contact with the collector, a lateral SCR-like structure is created which provides for double carrier injection during breakdown.

Generally speaking an SCR provides an open circuit when the voltage across it is positive and less than a trigger voltage. When the voltage rises to be equal to or greater than the trigger voltage, the SCR provides a low-resistance current path between the first and second nodes. The SCR then maintains the current path as long as the voltage across the first and second nodes is equal to or greater than a holding voltage that is lower than the trigger voltage.

The operation of the structure of FIG. 4 can be considered in three phases or states. During the off-state, when the voltage across the collector and emitter is positive and less than the breakdown voltage and trigger voltage, the voltage reverse biases the junction between p-base 402 and n-epitaxial layer 404. The reverse-biased junction, in turn, blocks charge carriers from flowing between collector and emitter.

During avalanche breakdown when the voltage is greater than the breakdown voltage Vbr but less than the trigger voltage Vtr—the current through the device is the avalanche current of the reverse biased base/collector junction between p-base 402 and n-epitaxial layer 404. The rest of generated carriers are peaking up: holes from the base region 402 at the base contact, and electrons from the n-epitaxial/collector region at the collector contact.

During early triggering (triggering phase "A"), first the potential distribution due to the avalanche current of the holes through the base region opens the base/emitter junction between the base 402 and n-emitter 408 of the BJT, thus starting avalanche-injection conductivity modulation when blocked by reverse biased conductivity. This positive feedback allows higher currents to be reached.

Subsequently during triggering phase "B" the potential distribution near the p-region 430 (which effectively defines an SCR-like p-emitter) is such as to open the junction between the p-region 430 and the n-epitaxial layer 404. This allows the flow of avalanche holes from the base 402 to be replaced by the flow of injected carriers from the p-region 430.

In the on state the current is thus determined by the counter injection though these two forward biased junctions: n-emitter 408 (BJT emitter) and p-region 430 (SCR-emitter). All other regions are overpumped by carries (i.e. n~p>>$N_D$,$N_A$, where n and p are the number of charge carriers in the form of electrons and holes, respectively, and $N_D$,$N_A$, are the donor and acceptor concentrations of the n-collector and p-base regions of the structure, respectively.)

Thus, during an ESD pulse, the lateral SCR-like structure introduced by the additional p+ emitter provides for double injection of carriers. This results in lower electric fields and a redistribution of current in the bulk carrier transport to provide superior ESD robustness.

Figure 5:
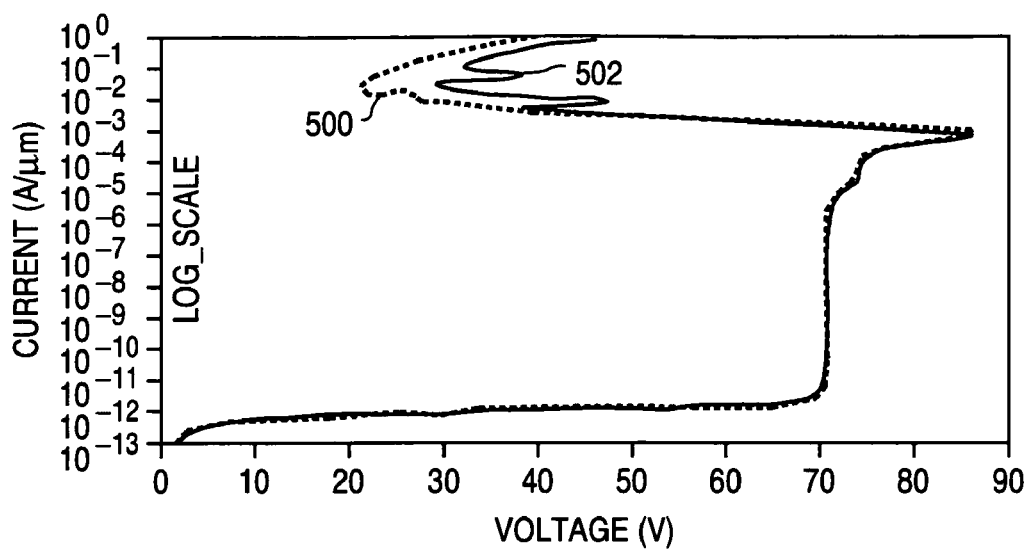
FIG. 5 shows the I-V curve for a device of the invention compared to that of a prior art BJT.
Figure 6:
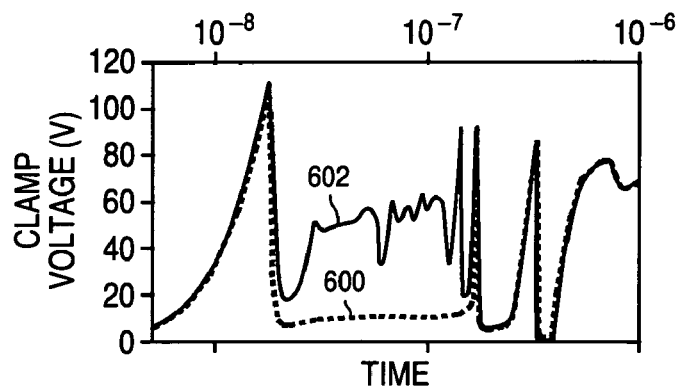
FIG. 6 shows voltage variations with time for a device of the invention compared to that of a prior art BJT.
Figure 7:
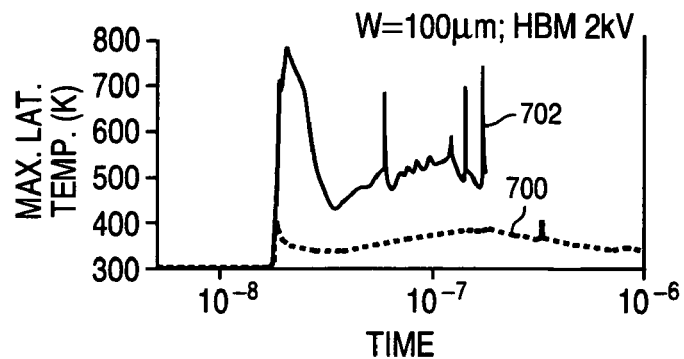
FIG. 7 shows maximum lattice temperature variations with time for a device of the invention compared to that of a prior art BJT.

On the other hand, during normal operation, the isolation of the n-emitter 408 from the p-emitter 430 by the n-epitaxial region, and the fact that the p-emitter and n-collector are contacted by a common contact, ensure that the characteristics of the device remain essentially the same as for a normal NPN BJT. Even during an ESD pulse, the snapback characteristics of the I-V curve remains much the same as shown by the curves of FIG. 5. The simulation I-V curve 500 of the device of the invention shows characteristics that are essentially the same as the curve 502 of a normal NPN BJT, with only a slight reduction in triggering voltage. However, a marked improvement is achieved in the collector (anode) voltage and maximum lattice temperatures of the structure, as shown by the curves of FIGS. 6 and 7, respectively. FIG. 6 shows simulated clamping voltage versus time curves for a structure of the invention (curve 600) compared to that of a regular NPN BJT (curve 602). This shows that the clamping voltage of the structure of the invention drops down significantly after the initial voltage pulse, which also results in significant reductions in lattice temperature as shown in FIG. 7. FIG. 7 shows simulation results of maximum lattice temperature changes with time for a device of the invention (curve 700) compared to a regular NPN BJT (curve 702).

While the present invention has been described with respect to particular embodiments, it will be appreciated that the invention can be implemented in different configurations without departing from the scope of the invention.

What is claimed is:

1. An ESD protection structure, comprising
a NPN BJT-like structure having a base, an emitter and a collector, and a p-doped region separated from the base by an isolation region and abutting or extending into the collector and a common contact element contacting both the p-doped region and the collector.

2. A structure of claim 1, wherein the p-doped region comprises a shallow p+region.

3. An ESD protection structure, comprising
a BJT structure that includes
a n-type emitter,
at least one p-type base region formed in a n-material, and
a n-type collector region, and further comprising
a p-type region separated from the base by an isolation region and abutting or extending partially into the collector, and a common contact element contacting both the p-doped region and the collector.

4. A structure of claim 3, wherein the n-type collector comprises a shallow n+ region formed in a n-sinker.

5. A structure of claim 4, wherein the n-sinker is formed in a n-epitaxial region.

6. A structure of claim 4, wherein the p-type region is formed as a shallow p+region abutting or partially replacing the shallow n+region.

7. A structure of claim 5, wherein the n-epitaxial region is formed on a n-buried layer, and the n-type emitter is formed in the p-type base region.

8. A structure of claim 5, wherein the n-sinker is formed further away from the n-type emitter of the BJT than is typical for a regular BJT made by the same process as the present structure.

9. A structure of claim 8, wherein the n-sinker is formed 0.5 μm to 1 μm further away from the n-type emitter of the BJT than is the case for a regular BJT made by the same process as the present structure.

* * * * *